(12) United States Patent
Tan et al.

(10) Patent No.: US 7,556,891 B2
(45) Date of Patent: Jul. 7, 2009

(54) METHOD AND APPARATUS FOR CONTACT HOLE UNIT CELL FORMATION

(75) Inventors: Soon Yoeng Tan, Skudai (MY); Sia Kim Tan, Singapore (SG); Qunying Lin, Singapore (SG); Huey Ming Chong, Singapore (SG); Liang-Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 906 days.

(21) Appl. No.: 10/973,182

(22) Filed: Oct. 25, 2004

(65) Prior Publication Data

US 2006/0088770 A1    Apr. 27, 2006

(51) Int. Cl.
   G03F 9/00      (2006.01)
   G03F 7/20      (2006.01)
(52) U.S. Cl. .......................................... 430/5; 430/311
(58) Field of Classification Search ...................... 430/5, 430/311, 322
   See application file for complete search history.

(56) References Cited

U.S. PATENT DOCUMENTS

| | | | |
|---|---|---|---|
| 6,653,026 B2 | 11/2003 | Pierrat et al. | |
| 6,700,649 B2 | 3/2004 | Chandhok et al. | |
| 6,711,732 B1 | 3/2004 | Dai et al. | |
| 2003/0027366 A1 * | 2/2003 | Dulman et al. | 438/16 |

OTHER PUBLICATIONS

Petersen, et al., "Development of a Sub-100mm Integrated Image System Using Chromeless Phase-Shifting Imaging with Very High NA KrF Exposure and Off-axis Illumination" Proc. SPIE vol. 4691, p. 515-529, Optical Microlithography XV, Anthony Yen; Ed. Jul. 2002.
"Chromeless Phase Lithography" http://www.masktools.com/content/cpl.pdf.
Van Den Broeke, "Transferring Phase-Shifting Mask Technology into Mainstream Manufacturing." Oct. 1996. Issue 5, section 5. Semiconductor Fabtech. Henley Publishing, London.

* cited by examiner

Primary Examiner—Kathleen Duda
Assistant Examiner—Brittany Raymond
(74) Attorney, Agent, or Firm—Mikio Ishimaru (57) ABSTRACT

A method for forming a contact hole unit cell is provided. A light transparent contact hole region of a first phase is positioned at a first plane. A light transparent phase-shifting region of a second phase is positioned at the first plane, the second phase being substantially out of phase with the first phase. The phase-shifting region substantially surrounds the contact hole region. A light transparent border region is positioned at the first plane outside the phase-shifting region. The border region has a phase substantially the same as that of the contact hole region. A chrome pad is positioned at the first plane outside and contacting at least a portion of the border region. The contact hole region, the phase-shifting region, the border region, and the chrome pad are positioned to cause light from the first plane to be reinforcing in a target contact hole configuration on a second plane and to be substantially neutralizing outside the target contact hole configuration on the second plane.

20 Claims, 7 Drawing Sheets

METHOD AND APPARATUS FOR CONTACT HOLE UNIT CELL FORMATION

TECHNICAL FIELD

The present invention relates generally to photolithography, and more particularly to photolithographic contact hole formation in integrated circuits.

BACKGROUND ART

Almost every modern electronic product, ranging from toys to massive computers, now uses integrated circuits ("ICs"). ICs are generally made using photolithographic processes that involve manufacturing a template containing patterns of the electrical circuit as transparent and opaque areas. The patterned template is referred to as a "reticle" or "mask".

A radiation source, such as a light, is used to copy or "pattern" multiple images of the mask onto a photosensitive material, such as a photoresist, on the surface of a silicon wafer. Once features are patterned on the photoresist, further processing is performed to form various structures on the silicon wafer. The completed wafer is then cut (or "diced") to form the individual ICs.

Engineers typically use computer-aided design ("CAD") to create a schematic design of the mask. One technique, Levenson Phase-Shifting, also known as Alternating Aperture Phase-Shifting, is used to create small features on ICs. Such small features are generated by a pair of areas in the mask called shifters.

An alternating element phase-shift mask ("PSM") normally includes a substantially transparent substrate composed, for example, of quartz. Phase-shifting material is situated on the mask substrate to provide a phase shift to light radiation as it passes through the mask. The phase-shifting material may be, for example, silicon nitride or other suitable transparent material such as oxides or oxynitrides. In such an alternating element PSM, discrete non-phase-shifting components are disposed alternatively adjacent to discrete phase-shifting components.

An attenuated PSM contains discrete layers of absorbers, composed for example of chromium, disposed on the mask substrate.

Hybrid attenuated-unattenuated PSMs can also be combined with alternate element PSMs.

Shifters change the phase of the light passing through them. Two shifters can be used on a mask to shine light on the same region of a photoresist. In a region where the light passing through one of the shifters is in phase with the light passing through the other shifter, a feature can be created on the photoresist that is narrower than the distance between the two shifters. By reducing the distance between the two shifters, very small features can be created on the photoresist. The width of the feature can be considerably less than could be produced by the same optical system without phase shifting.

Recent developments in PSM technology have been focused on single exposure chromeless phase lithography ("CPL"), also known as phase-edge chromeless off-axis illumination ("PCO"). While such a technique may be appropriate for making IC line and space structures, it is generally unsatisfactory for forming contact hole patterns. This is due in part to the different pattern designs needed for isolated contact, semi-dense contact, and dense array contact configurations. Randomly distributed contacts pose an additional problem because they do not fit into any of these other three types.

Thus, a need still remains for a unit cell CPL contact hole structure wherein the identical unit cell can be used in any contact arrangement, thereby enabling both randomly scattered and neatly arranged contact holes to be phase shifted using the same unit cell structure. A need also remains for improvements to the process margins. One such improvement would provide, for example, for increasing the intensity contrast of such a unit cell compared to attenuated phase-shifting mask contact techniques.

In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for forming a contact hole unit cell. A contact hole region of a first phase is positioned at a first plane, the contact hole region being transparent to light. A phase-shifting region of a second phase is positioned at the first plane, the second phase being substantially out of phase with the first phase. The phase-shifting region substantially surrounds the contact hole region and is transparent to light. A border region is positioned at the first plane outside the phase-shifting region. The border region has a phase substantially the same as that of the contact hole region and is transparent to light. A chrome pad is positioned at the first plane outside and contacting at least a portion of the border region. The contact hole region, the phase-shifting region, the border region, and the chrome pad are positioned to cause light from the first plane to be reinforcing in a target contact hole configuration on a second plane and to be substantially neutralizing outside the target contact hole configuration on the second plane. This method provides a contact hole structure wherein the identical unit cell can be used in any contact arrangement, thereby enabling both randomly scattered and neatly arranged contact holes to be phase shifted using the same unit cell structure.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known configurations and process steps are not disclosed in detail. Likewise, the drawings showing embodiments of the invention are semi-diagrammatic and not to scale and, particularly, some of the dimensions are for the clarity of presentation and are shown exaggerated in the FIGS. In addition, where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of the semiconductor wafer or die, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Photolithography is a well-known semiconductor industry process for forming lines, contacts, and other structures in integrated circuits ("ICs"). In conventional photolithography, masks (or "reticles") are prepared having patterns of transparent and opaque regions for each structure layer. Light shined through such a mask is then focused on a photoresist layer provided on a semiconductor wafer. The photoresist layer is then developed, with portions of the photoresist layer being removed so that the remaining portions are defined by the pattern. In this manner, the pattern of the mask is transferred to or printed onto the photoresist layer.

However, at the transition between the transparent and opaque regions of the mask, diffraction effects can render the transition edges indistinct, thereby adversely affecting the resolution of the photolithographic process. This phenomenon is increasingly becoming a concern as ICs continue to get smaller and smaller.

Phase shifting is a technique that uses phase constructive and destructive interference of the waves of incident light to improve the resolution of the photolithographic process. Such phase shifting shifts the phase of a first region of incident light waves relative to a second, adjacent region of incident light waves. Typically, the phase shifting shifts the phase of the light by about 180°. Such relative and generally contiguous phase shifting creates a more sharply defined interface between the first and second regions at a focal plane such as the photoresist. As a result, the boundary between exposed and unexposed portions of a photoresist can be more closely defined, and the features formed thereon can be smaller, when illuminating the photoresist through such a mask. This technique allows much greater structure density on the IC.

However, while phase shifting has been found to be effective for making IC line and space structures, it has generally been less satisfactory for forming contact hole patterns. This is due in part to the different pattern designs needed for isolated contact, semi-dense contact, dense array contact, and randomly distributed contact hole configurations.

In the present invention, a solution for contact hole patterns is provided. As described in greater detail below, the invention teaches providing a contact hole region that is phase shifted orthogonally from a surrounding phase-shifting mesa structure that has chrome pads at the corners thereof. (A "mesa" structure is an elevated structure that is formed above the structures that surround it.) This, in turn, is surrounded by another structure (or equivalent structures) having the same phase as the contact hole region. This multipart configuration lowers the secondary amplitude intensity of the light patterns of the mask and thereby suppresses side-lobe patterns that might otherwise form from diffraction effects at the edges of the mask pattern openings.

In one embodiment for non-dense contact hole configurations, for example, the contact hole region is a 0° (zero-degree) phase region, which causes little or no phase shift of light passing through the region. The surrounding phase-shifting mesa structure is a 180° phase region, which causes about a 180° phase shift of light passing through the region. A phase border of a zero-degree phase region, in turn, surrounds the 180° phase region. These regions and structures, together, ensure that destructive interference occurs at the phase edges, for sharply defining the desired target contact hole pattern on the photoresist without creating undesired fringing or side-lobe patterns thereon.

In those regions of the layout where no contact hole appears, a chrome pad is present on the mask to block light transmission in those areas.

With such a pattern and configuration, as thus disclosed and taught by the present invention, insertion of the unit cell can be done at any location of a designed structure to create a CPL mask for a contact hole. This can be accomplished for isolated contact, semi-dense contact, dense array contact, and randomly distributed contact configurations.

Optical proximity effects during the lithography process may produce variations in the dimensions of the contact holes as a function of the proximity of other nearby features. Known as "iso-dense bias", this optical proximity effect can create a difference between the printed dimensions of an isolated contact hole and the printed dimensions of a dense feature contact hole, even though both holes have the same design dimensions on the mask. Iso-dense bias can thus lead to critical dimension variability as a function of proximity to other features. Accordingly, iso-dense selective biasing adjustment may also be carried out on the contact holes of the present invention to obtain the desired critical dimension target on photolithographic wafer printing.

Thus, as will be further explained below in connection with the description of FIGS. 14 and 15, the present invention is used in a photolithographic process and system to provide unit cells on a photolithographic mask for precisely imaging contact hole patterns onto a resist on a semiconductor wafer substrate.

Figure 1:
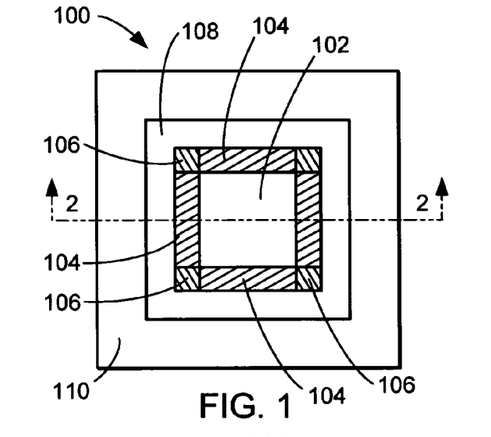
FIG. 1 is a top view of a unit cell in accordance with an embodiment of the present invention.

Referring now to FIG. 1, therein is shown a top view of a unit cell 100 in accordance with an embodiment of the present invention. The unit cell 100 is located on a photolithographic mask (not shown, but see the photomask 1404 in FIGS. 14 and 15).

The unit cell 100 has a contact hole region 102 located in the center thereof. On each side of the contact hole region 102 are phase-shifting orthogonal regions 104 arranged such that the contact hole region 102 is inside and surrounded by the phase-shifting orthogonal regions 104. As depicted, the phase-shifting orthogonal regions 104 are four rectangular strips that meet and/or overlap sequentially at their ends as multiple components of a square around or substantially surrounding the contact hole region 102. The corners of the square, where the phase-shifting orthogonal regions 104 meet and/or overlap, are covered with chrome pads 106 positioned thereon.

The phase-shifting orthogonal regions 104 and the chrome pads 106, in turn, are surrounded by a border region 108. The border region 108, the chrome pads 106, the phase-shifting orthogonal region 104, and the contact hole region 102 in the center thereof are on, in, or under the mask but are considered to be all positioned at the mask in substantially the same plane and together constitute the unit cell 100. The regions outside the unit cell 100 are then provided with a chrome pad 110 that is non-transmissive to light and is positioned in regions where no contact holes or other features appear in the layout. In one embodiment, the chrome pad 110 can be positioned and/or configured outside and contacting at least a portion of the border region 108. For contact hole formation, then, the chrome pad 110 is mainly used for configurations where a single, isolated contact hole ("iso structure"), a semi-dense contact configuration, or a random structure is being fabricated.

The contact hole region 102, the border region 108, and the phase-shifting orthogonal regions 104 are all transparent to light. The contact hole region 102 and the border region 108 both have substantially the same phase assignment. The phase-shifting orthogonal regions 104 have a different, usually opposite, phase assignment, that is out of phase with the phase of the contact hole region 102 and the border region 108. For example, if the contact hole region 102 and the border region 108 both have a 0° configuration, then the phase-shifting orthogonal regions 104 will typically be 180° regions. As mentioned above, it will be understood, of course, that the unit cell 100 forms but a small portion of an overall mask for the fabrication of a particular IC layer.

Figure 2:
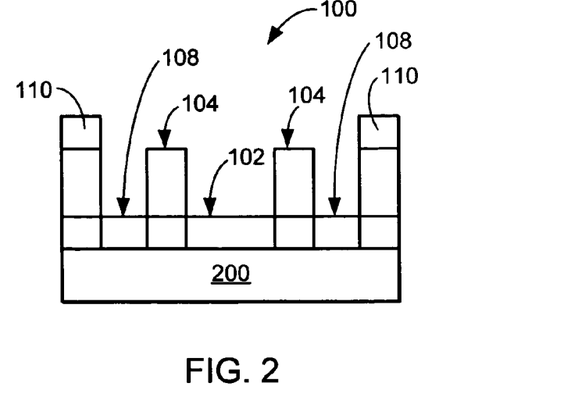
FIG. 2 is a cross-sectional view of the structure of FIG. 1 taken on line 2-2 in FIG. 1.

Referring now to FIG. 2, therein is shown a cross-sectional view, taken on line 2-2 in FIG. 1, of the unit cell 100. As can be seen, the phase-shifting orthogonal regions 104 constitute a 180° phase mesa formed on a mask substrate 200, along with the contact hole region 102 and the border regions 108.

Figure 3:
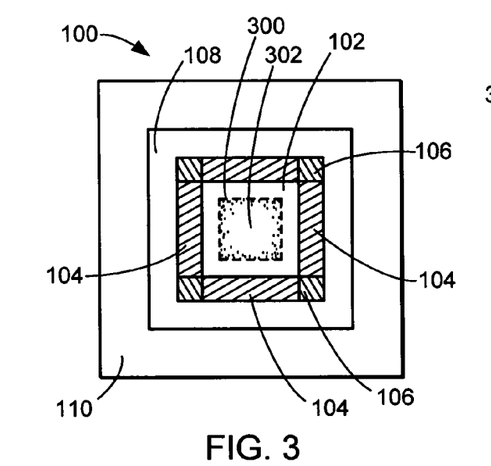
FIG. 3 is a view of the structure of FIG. 1 with a figurative illustration thereon of a target contact hole configuration and the center of a corresponding contact hole light pattern generated by the structure of FIG. 1.

Referring now to FIG. 3, therein is shown a view of the unit cell 100 with a figurative illustration thereon of a target contact hole configuration 300 and of the corresponding center portion of a contact hole light pattern 302 that would be generated by the unit cell 100. The target contact hole configuration 300 and the contact hole light pattern 302 are illustrated as if being seen and imaged in a plane at the surface of a target resist (not shown) located on a second plane beneath the plane of the unit cell 100 itself.

Figure 4:
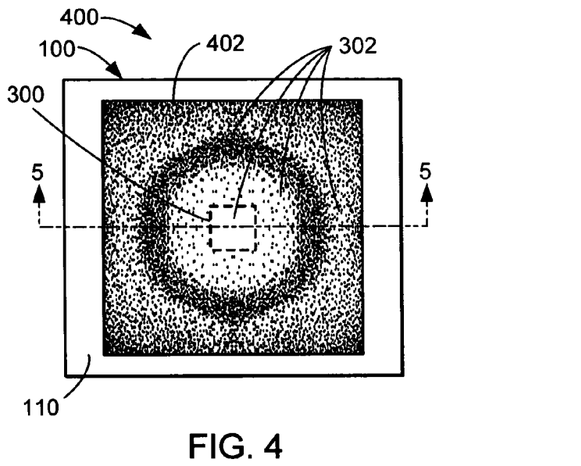
FIG. 4 is an illustration of an exemplary light intensity profile of the contact hole light pattern generated by the structure of FIG. 3.

Referring now to FIG. 4, therein is shown an illustration of an exemplary light intensity profile 400 of the contact hole light pattern 302 that is generated by the unit cell 100 (FIGS. 3 and 1, respectively). The exemplary light intensity profile 400 is illustrated as if it were being viewed through a virtual window 402 in the unit cell 100 and were being seen and imaged in the second plane at the surface of the target resist (not shown) therebeneath.

Figure 5:
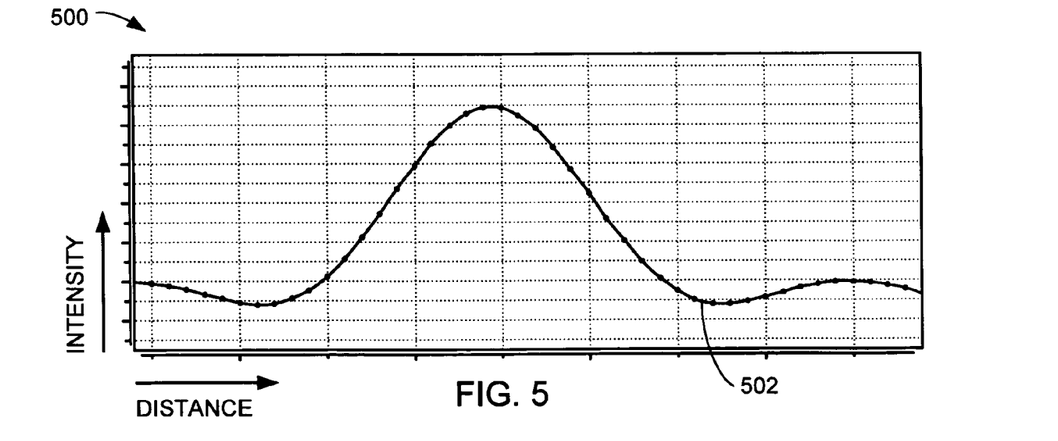
FIG. 5 is a graphical representation of the exemplary light intensity profile of the contact hole light pattern of FIG. 3 taken on line 5-5 through the center of FIG. 4.

Referring now to FIG. 5, therein is shown a graphical representation 500 of the exemplary light intensity profile 400 (FIG. 4) of the contact hole light pattern 302 (FIG. 4), taken on line 5-5 through the center of the exemplary light intensity profile 400 in FIG. 4. The exemplary light intensity profile 400 is thus represented by the profile line 502.

Figure 6:
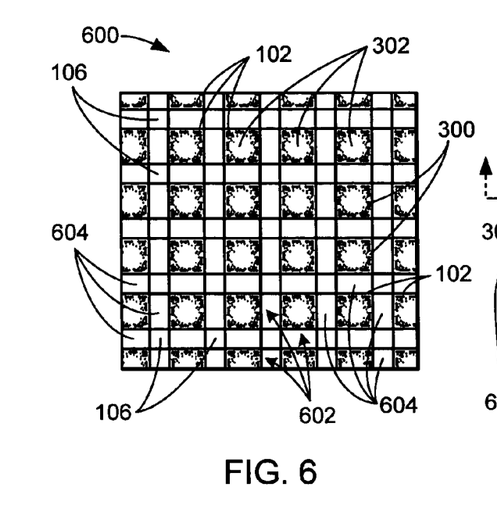
FIG. 6 is a view of a dense array structure in accordance with an embodiment of the present invention.

Referring now to FIG. 6, therein is shown a dense array structure 600 in accordance with an embodiment of the present invention. The dense array structure 600 is configured for forming a large number of contact holes in close proximity to one another. For example, in one embodiment, at least one of the contact hole region 102 can be positioned and/or configured outside and contacting at least a portion of phase-shifting orthogonal regions 604 substantially surrounding another of the contact hole region 102. The dense array structure 600 is based on unit cells 602 that are similar to the unit cell 100 (FIG. 1), except that border regions and outer chrome pads, such as the border region 108 (FIG. 1) and the chrome pads 110 (FIG. 1), are unnecessary due to the close proximity of the unit cells 602. That is, since the unit cells 602 themselves surround one another and are all of the same phase, they thereby perform for their immediate neighbors the same relative function as the border regions 108 perform for stand-alone unit cells such as the unit cell 100. Thus, each of the unit cells 602 is also a border region of like phase for each of its neighboring unit cells.

As shown in FIG. 6, then, each of the unit cells 602 in the dense array structure 600 includes a contact hole region 102 inside and surrounded by phase-shifting orthogonal regions 604, similarly as in the unit cell 100. In the same way, the overlapping portions of the phase-shifting orthogonal regions 604 also have the chrome pads 106 on the surfaces thereof. Additionally, as also in the unit cell 100, the contact hole region 102 has an opposite phase relationship to the phase-shifting orthogonal regions 604, for example, 0° and 180° regions, respectively.

Due to the density and close proximity of the unit cells 602 to one another, contiguous cells share the respective phase-shifting orthogonal regions 604 located therebetween, as illustrated. Thus, the unit cells 602 that are within the dense array structure 600 (i.e., those not on the perimeter thereof) do not require border regions or chrome pads corresponding to the border region 108 and the chrome pads 110, since these same functions are performed instead by their contiguous neighbors.

Figure 7:
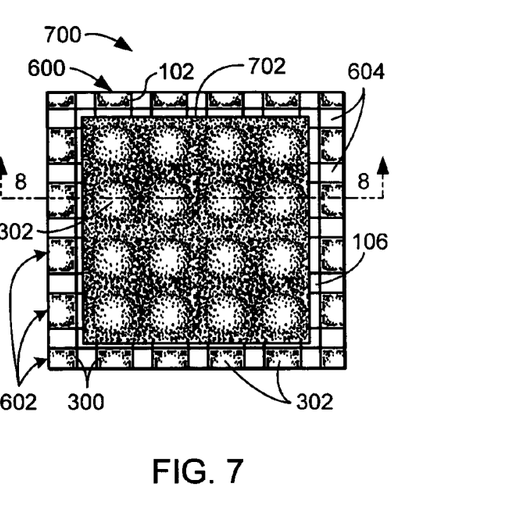
FIG. 7 is an illustration of an exemplary light intensity profile of the contact hole light patterns generated by the structure of FIG. 6.

Referring now to FIG. 7, therein is shown an illustration of an exemplary light intensity profile 700 of the contact hole light patterns 302 that are generated by the unit cells 602 in FIG. 6. The exemplary light intensity profile 700 is illustrated as if it were being viewed through a virtual window 702 in the dense array structure 600 and were being seen and imaged in a plane at the surface of a target resist (not shown) therebeneath.

Figure 8:
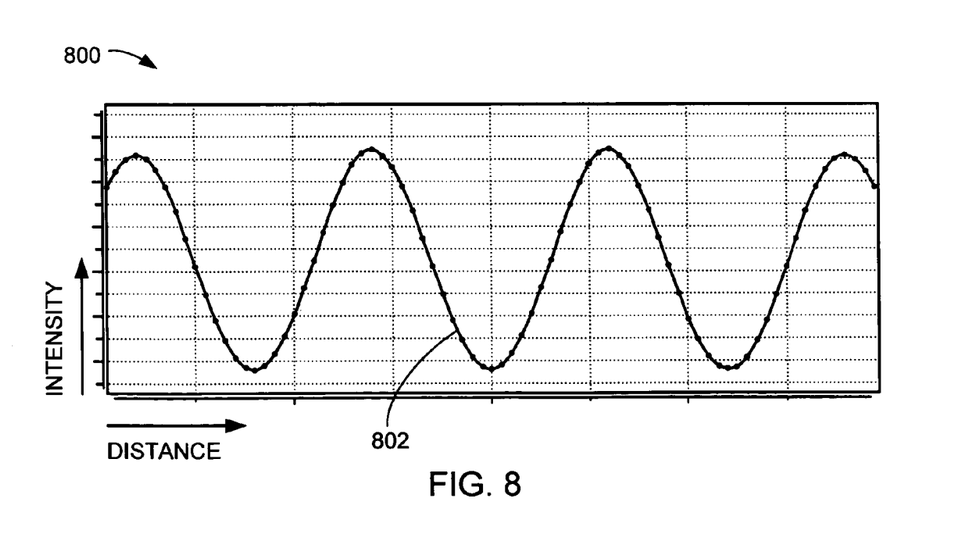
FIG. 8 is a graphical representation of the exemplary light intensity profile of the contact hole light patterns taken on line 8-8 through FIG. 7.

Referring now to FIG. 8, therein is shown a graphical representation 800 of the exemplary light intensity profile 700 (FIG. 7) of the contact hole light patterns 302 (FIG. 7), taken on line 8-8 through FIG. 7. The exemplary light intensity profile 700 is thus represented by the profile line 802.

Figure 9:
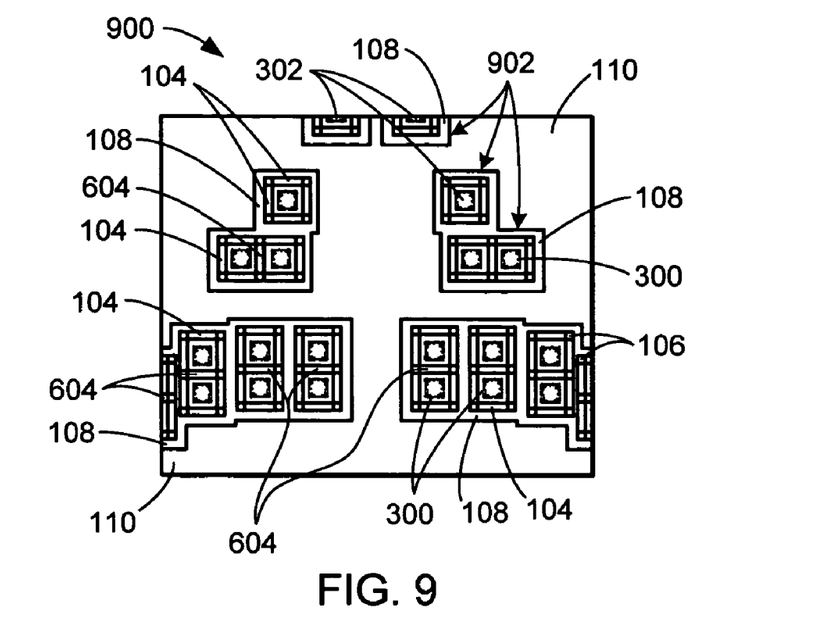
FIG. 9 is a view of a dense random structure in accordance with another embodiment of the present invention.

Referring now to FIG. 9, therein is shown a dense random structure 900 in accordance with another embodiment of the present invention. The dense random structure 900 includes unit cells 902 that are located variously thereon. The unit cells 902 that are contiguous with one another share common phase-shifting orthogonal regions 604, in the same manner as the unit cells 602 (FIG. 6). For example, in one embodiment, at least one of the contact hole region 102, of FIG. 6, can be positioned and/or configured outside and contacting at least a portion of the phase-shifting orthogonal regions 604 substantially surrounding another of the contact hole region 102. Those unit cells 902 that are not contiguous and at greater spacings do not share common phase-shifting orthogonal regions across those greater spacings, but rather each have their own phase-shifting orthogonal regions 104 in that respect.

As also depicted in FIG. 9, the individual phase-shifting orthogonal regions 104 that are not shared in common are separated by border regions 108. Additionally, for those unit cells 902 that are separated respectively from each other by distances greater than the width of the border regions 108, the chrome pad 110 is provided to cover such separation regions.

Figure 10:
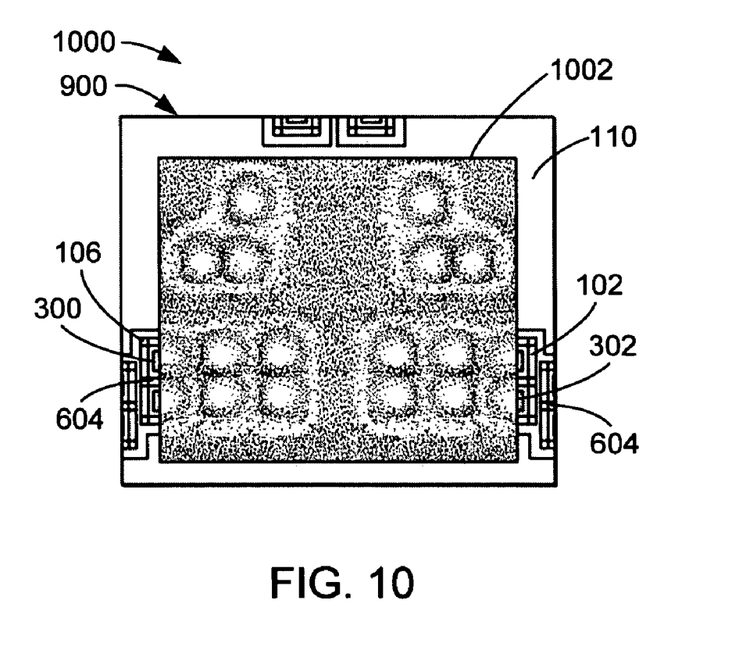
FIG. 10 is a view of an exemplary light intensity profile of the contact hole light patterns generated by the structure of FIG. 9.

Referring now to FIG. 10, therein is shown an exemplary light intensity profile 1000 of the contact hole light patterns 302 that are generated by the unit cells 902 in FIG. 9. The exemplary light intensity profile 1000 is illustrated as if it were being viewed through a virtual window 1002 in the dense random structure 900 and were being seen and imaged in a plane at the surface of a target resist (not shown) therebeneath.

Figure 11:
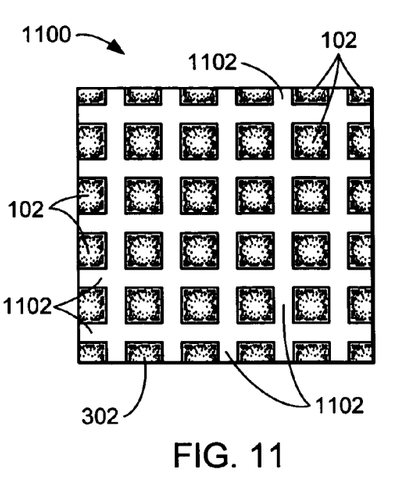
FIG. 11 is a view, in accordance with still another embodiment of the present invention, of an attenuated dense array structure with an attenuating coating over the outer edges of the contact hole regions and the phase-shifting orthogonal regions.

Referring now to FIG. 11, therein is shown an attenuated dense array structure 1100 similar to the dense array structure 600 (FIG. 6). The attenuated dense array structure 1100 includes an attenuating coating 1102 that is a thin, transparent, light-attenuating coating, such as a very thin layer of chromium. The attenuating coating 1102 is deposited over the phase-shifting orthogonal regions (not visible, but comparably the same as the phase-shifting orthogonal regions 604 (FIG. 6)), and optionally over the outer edges of the contact hole regions 102, as appropriate for the application at hand. The attenuating coating 1102, for example, may be applied so as to cause a six-percent attenuation in the light transmission through the phase-shift mask ("PSM"). This has the effect of increasing the contrast between the light and dark regions of the contact hole light patterns 302.

Figure 12:
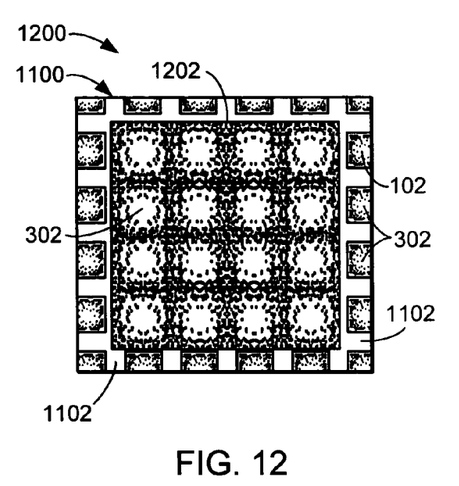
FIG. 12 is a view of an exemplary light intensity profile of the contact hole light patterns generated by the structure of FIG. 11.

Referring now to FIG. 12, therein is shown an exemplary light intensity profile 1200 of the contact hole light patterns 302 that are generated by the attenuated dense array structure 1100. The exemplary light intensity profile 1200 is illustrated as if it were being viewed through a virtual window 1202 in the attenuated dense array structure 1100 and were being seen and imaged in a plane at the surface of a target resist (not shown) therebeneath.

Figure 13:
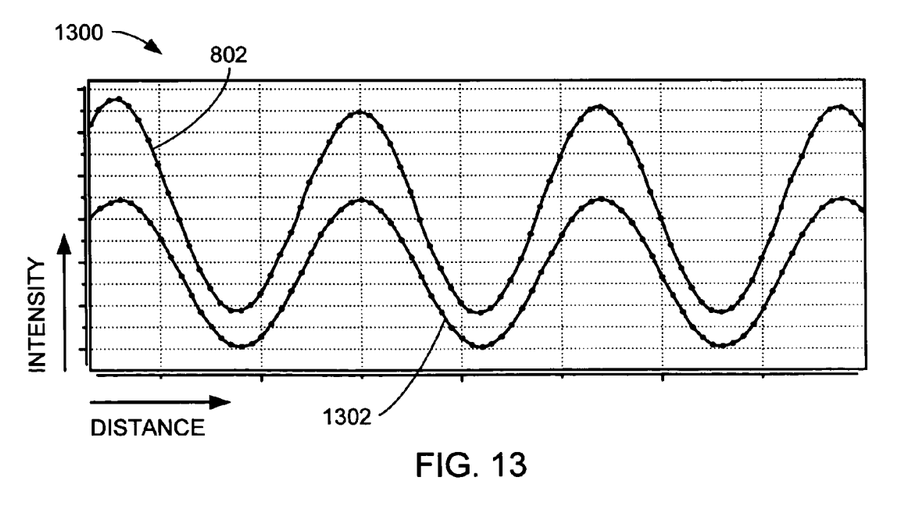
FIG. 13 is a graphical representation of the exemplary light intensity profile of the contact hole light patterns taken through the exemplary light intensity profile of FIG. 12, and of the graphical representation from FIG. 8.

Referring now to FIG. 13, therein is shown a graphical representation 1300 of the exemplary light intensity profile 1200 (FIG. 12) of the contact hole light pattern 302 (FIG. 12), taken through the exemplary light intensity profile 1200 in FIG. 12. The exemplary light intensity profile 1200 is thus represented by the profile line 1302. For comparison, to illustrate the effect of the attenuating coating 1102, the profile line 802 from FIG. 8 of the dense array structure 600 is also included in FIG. 13.

Figure 14:
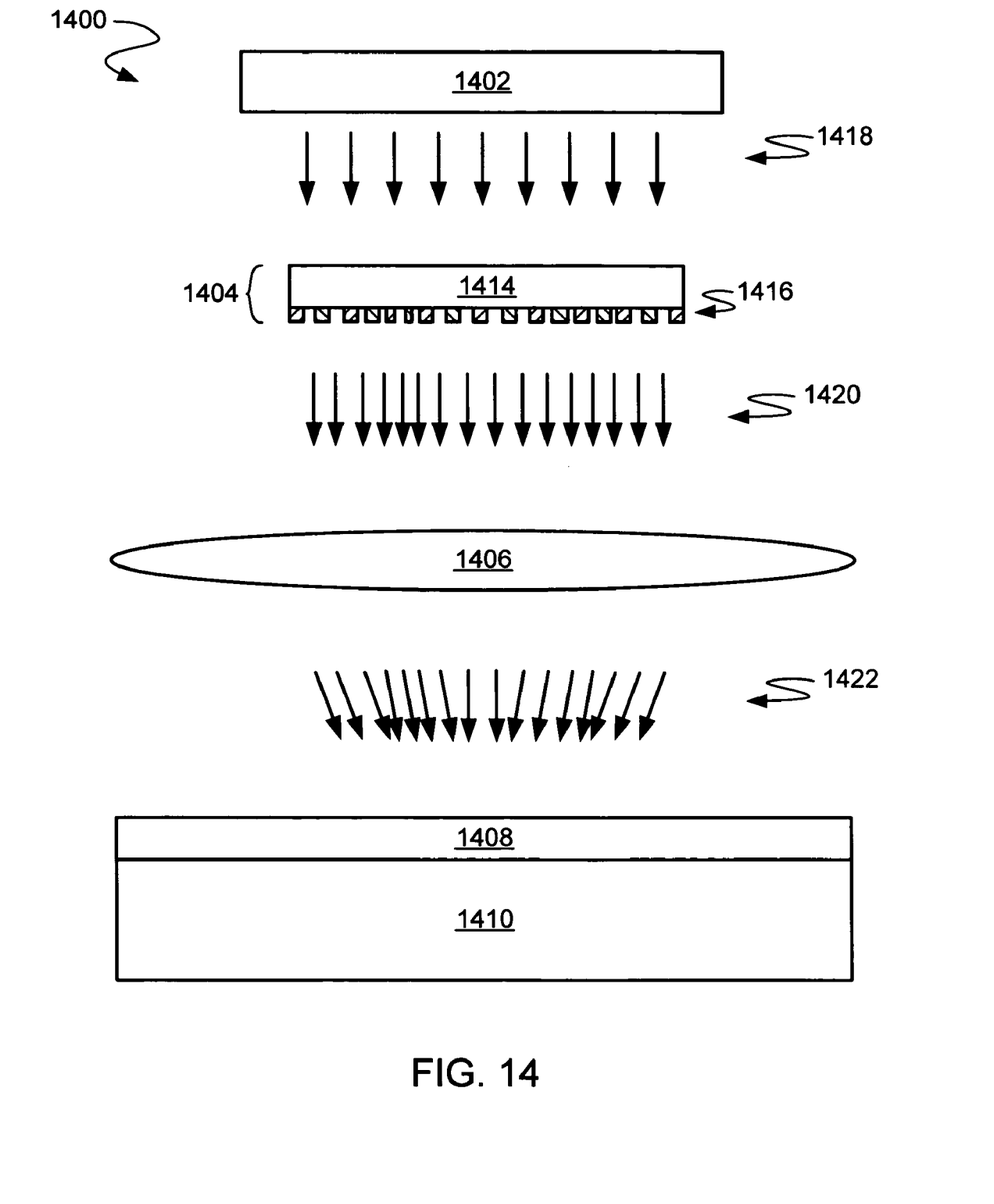
FIG. 14 is a simplified schematic of a photolithographic system.

Referring now to FIG. 14, therein is shown a simplified schematic of a photolithographic system 1400. In the photolithographic system 1400, single-wavelength ultra-violet radiation is directed from an illumination source 1402 through a photomask 1404 and a lens 1406 onto a photoresist layer 1408 that has been deposited onto a semiconductor wafer 1410. Although the invention is described with respect to single-wavelength ultra-violet illumination, it will be readily understood that the invention is applicable to any wavelength of radiation, and that appropriate modifications for other wavelengths will be obvious to those of ordinary skill in the art based upon the description of the present invention provided herein.

The photomask 1404 includes a light-transparent substrate 1414, of a material such as fused silica or quartz, with a patterned mask coating 1416.

The illumination source 1402 produces light 1418 that the photomask 1404 selectively allows through as patterned light 1420 to be focused by the lens 1406. Focused patterned light 1422 reproduces the mask pattern of the patterned mask coating 1416 on selected areas of the photoresist layer 1408. The photoresist layer 1408, as is conventionally known, is a photosensitive material that is used in photolithography to transfer patterns from a mask onto a wafer for forming integrated circuit elements thereon.

Thus, after exposure, the patterned photoresist layer 1408 is used as a mask in such a photolithographic process to form features or to implant regions on the semiconductor wafer 1410, or on various layers of material previously deposited or grown on the semiconductor wafer 1410. The goal in the photolithographic field is to keep reducing the size of such features and implant regions.

Unfortunately, as discussed earlier, in photolithographic systems even a geometrically perfect lens cannot separate two points below a minimum distance. When the two points are less than this minimum distance from each other, diffraction and interference effects prevent them from being separated or "resolved". Such diffraction effects, which are due to the wave nature of the light 1418, cause peaks and valleys to occur in the intensity of the light 1418 passing through an opening, such as an opening in the patterned mask coating 1416, and falling on the photoresist layer 1408 on the semiconductor wafer 1410. Interference effects occur with side-by-side openings, where the peaks and valleys of the light waves can interfere so as to cancel each other out, or can reinforce and amplify each other, depending on the locations of the openings.

When two points are very close, the diffraction effect spreads the light from these two points across the imaging lens. If the two points are sufficiently close, the light will be diffracted out of the path of the lens. In this case, the points will be too close to each other and they will be under the limit of resolution of the system. The resolution of a non-perfect lens depends upon the wavelength of the light source and the numerical aperture ("NA") of the lens. Two images are considered as being resolvable when the intensity between them drops to 80 percent of the image intensity. Thus, two images are considered resolvable when the following equation is fulfilled:

$$2D = 0.6 \lambda / NA$$

where: 2D is the separation of the two images;
λ is the wavelength of the illumination source 1402; and
NA is the numerical aperture of the lens 1406.

In an effort to overcome diffraction and interference problems, various phase shifting systems have therefore been developed, as described.

Figure 15:
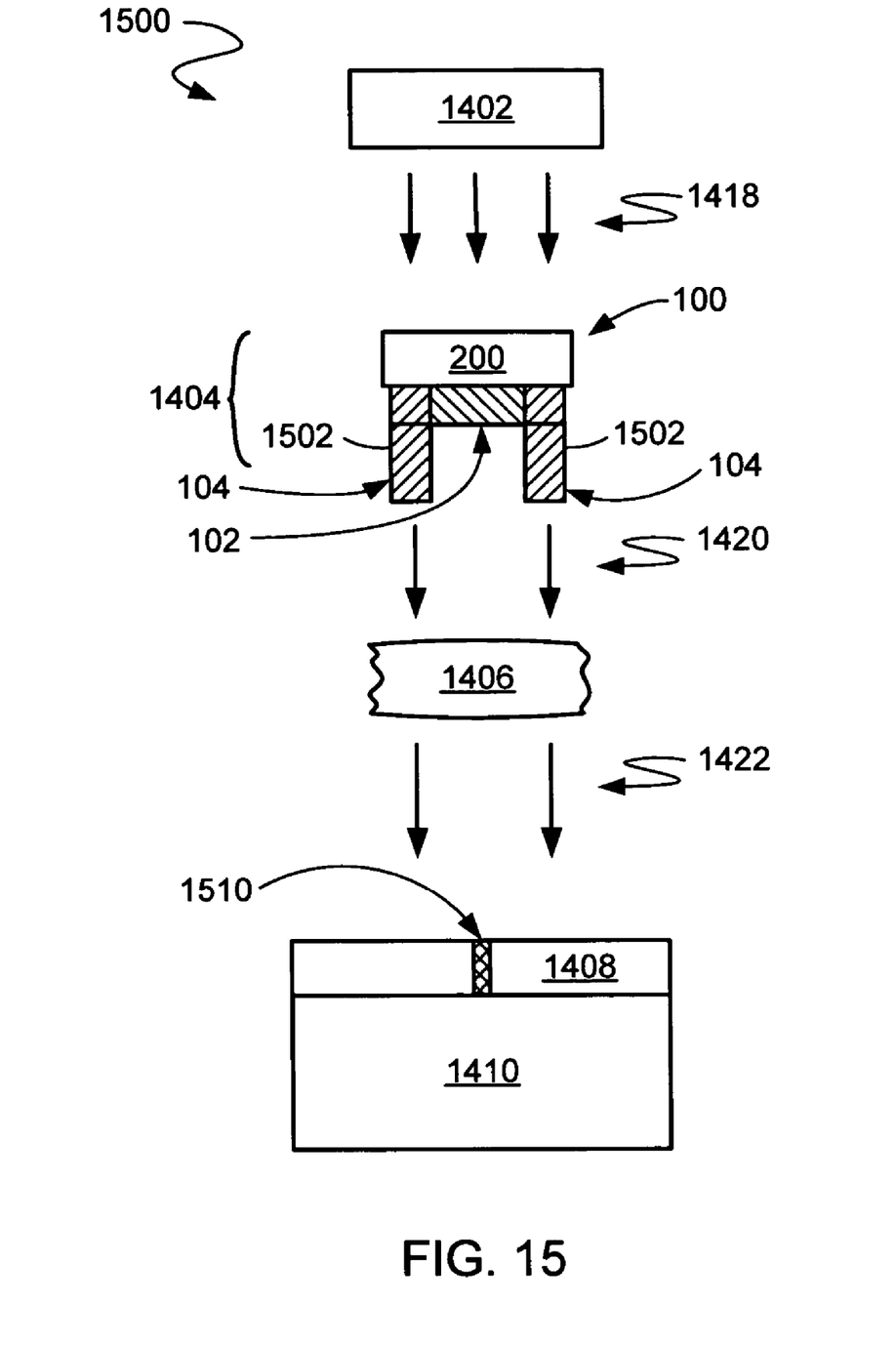
FIG. 15 is a simplified schematic of a phase shifting photolithographic system utilizing a contact hole unit cell according to the present invention.

Referring now to FIG. 15, therein is shown a simplified schematic of a phase shifting photolithographic system 1500 utilizing a contact hole unit cell 100 according to the present invention. The center portion of the lens 1406 is pictured where the angle of the focused light 1422 is least affected. As in the photolithographic system 1400 (FIG. 14), light 1418 of a single wavelength is directed from the illumination source 1402 through the photomask 1404 and the lens 1406 onto the photoresist layer 1408 on the semiconductor wafer 1410.

The phase shifting photolithographic system 1500 has the adjacent contact hole region 102 and phase-shifting orthogonal regions 104 located at a first plane, the first plane being the plane of the photomask 1404. The light 1418 passes through the contact hole region 102 and the phase-shifting orthogonal regions 104, which are transparent to light.

Since phase shifting of light occurs as a function of the thickness of the shifter material, an extra layer of transparent shifter material 1502 is added to the phase-shifting orthogonal regions 104 to cause additional phase shifting. This extra layer of transparent shifter material 1502, such as silicon or quartz, produces a phase shift of 180° relative to the contact hole region 102. This corresponds to an optical path length difference of λ/2. Thus, the phase-shifting orthogonal regions 104 are substantially out of phase by 180 degrees, or n radians, with the contact hole region 102.

Since phases of light which are substantially out of phase neutralize and therefore cancel where they overlap, and vice versa, the contact hole region 102 and the phase-shifting orthogonal regions 104 cause constructive (reinforcing) and destructive (neutralizing) interference in the patterned light 1420 in a second plane, the second plane being the photoresist layer 1408. Thus, the contact hole region 102 and the phase-shifting orthogonal regions 104 create a photoresist feature 1510 in the photoresist layer 1408 that is below or smaller than the inherent resolution limit of the lens 1406 itself.

The phase shifting photolithographic system 1500 thus allows features such as the photoresist feature 1510 to be much smaller than a system not using phase shifting.

Figure 16:
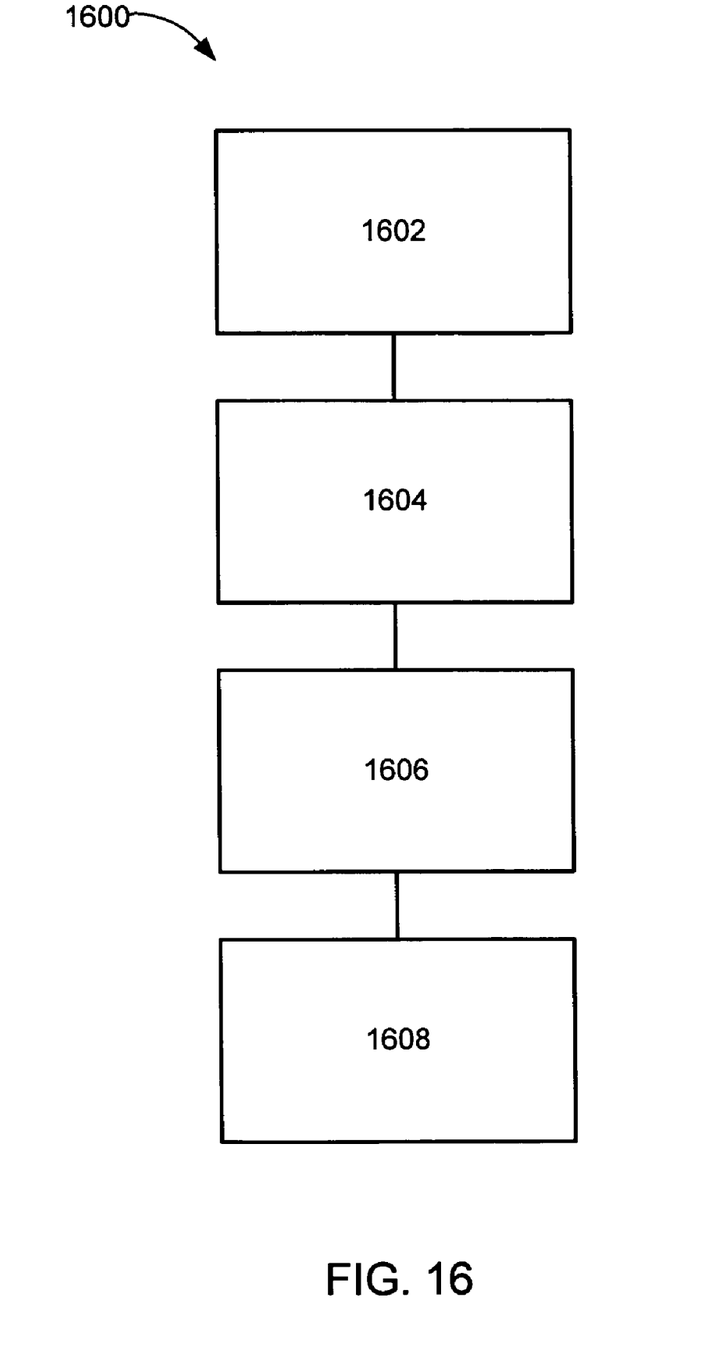
FIG. 16 is a flow chart of a method for forming a contact hole unit cell in accordance with an embodiment of the present invention.

Referring now to FIG. 16, therein is shown a flow chart of a method 1600 for forming a contact hole unit cell in accordance with the present invention. The method 1600 includes positioning a contact hole region of a first phase at a first plane, the contact hole region being transparent to light, in a block 1602; positioning a phase-shifting region of a second phase at the first plane, the second phase being substantially out of phase with the first phase, and the phase-shifting region substantially surrounding the contact hole region and being transparent to light, in a block 1604; positioning a border region at the first plane outside and substantially surrounding the phase-shifting region, the border region having a phase substantially the same as that of the contact hole region and being transparent to light, in a block 1606; and positioning the contact hole region, the phase-shifting region, and the border region to cause light from the first plane to be reinforcing in a target contact hole configuration on a second plane and to be substantially neutralizing outside the target contact hole configuration on the second plane, in a block 1608.

Thus, it has been discovered that the unit cell CPL contact hole method and apparatus of the present invention furnish important and heretofore unknown and unavailable solutions, capabilities, and functional advantages for CPL contact hole formation at any location of a structure design, whether isolated contact, semi-dense contact, dense array contact, or randomly distributed contact. In this regard, it has been discovered that identical unit cell structures according to the present invention can be used on any contact arrangement, whether the contact holes are randomly scattered or neatly arranged.

Likewise, it has been discovered that the phase-shifting orthogonal regions 104 and 604 need not be in a box-shaped configuration of just four regions or segments. Other geometries, such as a circle, or a configuration having more or fewer regions surrounding the contact hole region 102, for example, can also be considered and utilized.

It has additionally been discovered that the intensity contrast of the unit cell according to the present invention is greatly increased as compared to conventional attenuated phase-shifting mask contact hole techniques, thus increasing the process margin.

It has been further discovered that the resulting processes and configurations are straightforward, economical, uncomplicated, highly versatile and effective, can be implemented by adapting known technologies, and are thus readily suited for manufacturing IC devices using CPL, while possessing full compatibility with related conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for forming a contact hole unit cell, comprising:
    positioning a contact hole region of a first phase at a first plane, the contact hole region being transparent to light;
    positioning a phase-shifting region of a second phase at the first plane, the second phase being substantially out of phase with the first phase, and the phase-shifting region substantially surrounding the contact hole region and being transparent to light;
    positioning a border region at the first plane outside the phase-shifting region, the border region having a phase substantially the same as that of the contact hole region and being transparent to light;
    positioning a chrome pad at the first plane outside and contacting at least a portion of the border region; and
    positioning the contact hole region, the phase-shifting region, the border region, and the chrome pad to cause light from the first plane to be reinforcing in a target contact hole configuration on a second plane and to be substantially neutralizing outside the target contact hole configuration on the second plane.

2. The method of claim 1 further comprising positioning a chrome pad at the first plane over corners where phase-shifting orthogonal regions meet or overlap.

3. The method of claim 1 wherein positioning the border region further comprises configuring at least a portion of the border region to include at least one other contact hole region.

4. The method of claim 1 further comprising positioning at least one of:
    a plurality of contact hole regions each separated from one another by one of the phase-shifting regions;

a dense array of the contact hole regions and the phase-shifting regions; and a dense random structure of the contact hole regions and the phase-shifting regions.

5. The method of claim 1 further comprising positioning an attenuating coating on at least the phase-shifting region.

6. A method for forming a contact hole unit cell, comprising:
   positioning a contact hole region of a 0° first phase at a photomask, the contact hole region being transparent to light;
   positioning a plurality of phase-shifting orthogonal regions of a 180° second phase at the mask, the plurality of phase-shifting orthogonal regions meeting sequentially to form a square around and to substantially surround the contact hole region such that the contact hole region is inside the phase-shifting orthogonal regions, and the phase-shifting orthogonal regions being transparent to light;
   positioning a chrome pad on the phase-shifting orthogonal regions where they meet;
   positioning at least one of a border region including at least one other of the contact hole region at the photomask outside and contacting at least a portion of the phase-shifting orthogonal regions, the border region having a phase the same as that of the contact hole region, and being transparent to light; and
   positioning the contact hole region, the phase-shifting orthogonal regions, and the border region to cause light from the photomask to be reinforcing in a target contact hole configuration on a photoresist and to be substantially neutralizing outside the target contact hole configuration on the photoresist.

7. The method of claim 6 further comprising positioning a chrome pad that is outside the border region and is non-transmissive to light.

8. The method of claim 6 wherein positioning the border region further comprises positioning the border region to substantially surround the phase-shifting orthogonal regions.

9. The method of claim 6 further comprising positioning at least one of:
   a plurality of contact hole regions each separated from one another by one of the phase-shifting orthogonal regions;
   a dense array of the contact hole regions and the phase-shifting orthogonal regions; and
   a dense random structure of the contact hole regions and the phase-shifting orthogonal regions.

10. The method of claim 6 further comprising positioning an attenuating coating on at least the phase-shifting orthogonal region.

11. A contact hole unit cell, comprising:
    a contact hole region of a first phase positioned at a first plane, the contact hole region being transparent to light;
    a phase-shifting region of a second phase positioned at the first plane, the second phase being substantially out of phase with the first phase, and the phase-shifting region substantially surrounding the contact hole region and being transparent to light;
    a border region at the first plane positioned outside the phase-shifting region, the border region having a phase substantially the same as that of the contact hole region and being transparent to light;
    a chrome pad at the first plane outside and contacting at least a portion of the border region; and
    the contact hole region, the phase-shifting region, the border region, and the chrome pad being positioned to cause light from the first plane to be reinforcing in a target contact hole configuration on a second plane and to be substantially neutralizing outside the target contact hole configuration on the second plane.

12. The contact hole unit cell of claim 11 further comprising a chrome pad positioned at the first plane over corners where phase-shifting orthogonal regions meet or overlap.

13. The contact hole unit cell of claim 11 wherein the border region further comprises at least a portion of the border region configured to include at least one other contact hole region.

14. The contact hole unit cell of claim 11 further comprising at least one of:
    a plurality of contact hole regions each separated from one another by one of the phase-shifting regions;
    a dense array of the contact hole regions and the phase-shifting regions; and
    a dense random structure of the contact hole regions and the phase-shifting regions.

15. The contact hole unit cell of claim 11 further comprising an attenuating coating on at least the phase-shifting region.

16. A contact hole unit cell, comprising:
    a contact hole region of a 0° first phase positioned at a photomask, the contact hole region being transparent to light;
    a plurality of phase-shifting orthogonal regions of a 180° second phase positioned at the photomask, the plurality of phase-shifting orthogonal regions meeting sequentially to form a square around and to substantially surround the contact hole region such that the contact hole region is inside the phase-shifting orthogonal regions, and the phase-shifting orthogonal regions being transparent to light;
    a chrome pad positioned on the phase-shifting orthogonal regions where they meet;
    at least one of a border region including at least one other of the contact hole region positioned at the photomask outside and contacting at least a portion of the phase-shifting orthogonal regions, the border region having a phase the same as that of the contact hole region, and being transparent to light; and
    the contact hole region, the phase-shifting orthogonal regions, and the border region being positioned to cause light from the photomask to be reinforcing in a target contact hole configuration on a photoresist and to be substantially neutralizing outside the target contact hole configuration on the photoresist.

17. The contact hole unit cell of claim 16 further comprising a chrome pad that is outside the border region and is non-transmissive to light.

18. The contact hole unit cell of claim 16 wherein the border region is configured to substantially surround the phase-shifting orthogonal regions.

19. The contact hole unit cell of claim 16 further comprising at least one of:
    a plurality of contact hole regions each separated from one another by one of the phase-shifting orthogonal regions;
    a dense array of the contact hole regions and the phase-shifting orthogonal regions; and
    a dense random structure of the contact hole regions and the phase-shifting orthogonal regions.

20. The contact hole unit cell of claim 16 further comprising an attenuating coating on at least the phase-shifting orthogonal regions.

* * * * *